United States Patent [19]

Mae et al.

[11] 4,146,111

[45] Mar. 27, 1979

[54] SPEAKER SYSTEM

[75] Inventors: Yutaka Mae; Shiro Iwakura; Sigeyuki Koga; Hideki Ogawa; Hideaki Kanda, all of Tokyo, Japan

[73] Assignee: Trio Kabushiki Kaisha, Tokyo, Japan

[21] Appl. No.: 758,759

[22] Filed: Jan. 12, 1977

[30] Foreign Application Priority Data

Jan. 19, 1976 [JP] Japan .................................... 51-4362

[51] Int. Cl.[2] ......................... H05K 5/00; G10K 13/00

[52] U.S. Cl. .................................... 181/154; 181/155; 181/156; 181/163

[58] Field of Search ................ 181/143, 144, 145-156, 181/160, 163, 171

[56] References Cited

U.S. PATENT DOCUMENTS

| | | | |
|---|---|---|---|
| 2,034,014 | 3/1936 | Wheeler et al. | 181/151 |
| 2,539,327 | 1/1951 | Reid et al. | 181/145 |
| 2,801,704 | 8/1957 | Martin | 181/144 |
| 2,811,215 | 10/1957 | Rudd et al. | 181/154 |

*Primary Examiner*—Donald A. Griffin
*Assistant Examiner*—Benjamin R. Fuller
*Attorney, Agent, or Firm*—Gerald J. Ferguson, Jr.; Joseph J. Baker

[57] ABSTRACT

A speaker system comprising a speaker cabinet having a forward baffle plate, two side plates and a rear plate, a passive diaphragm, a speaker mounted in the baffle plate of the speaker cabinet, an opening disposed in the baffle plate next to the speaker as an outlet for the sound radiated from the passive diaphragm, a dividing plate slantedly disposed between the baffle plate and the rear plate of the speaker cabinet, the dividing plate dividing the speaker cabinet into a first part including the speaker and a second part including the opening, the passive diaphragm being mounted in the dividing plate.

6 Claims, 4 Drawing Figures

[A]

[B]

SPEAKER SYSTEM

BACKGROUND OF THE INVENTION

1. Field of the Invention

This invention relates to a speaker system having a passive diaphragm.

2. Discussion of the Prior Art

In prior art speaker systems having a passive diaphragm, the passive diaphragm and speaker are mounted in the same plate, namely a baffle plate, as shown in FIGS. 1A and 1B. However, it has been difficult to install the passive diaphragm in smaller speaker systems since there is not enough space in the baffle plate.

SUMMARY OF THE INVENTION

The primary object of this invention is to provide a speaker system in which the above mentioned defect is eliminated.

Other objects and advantages of this invention will be apparent from a reading of the following specification and claims taken with the drawing.

DETAILED DESCRIPTION OF THE PREFERRED EMBODIMENTS OF THE INVENTION

Figure 1:
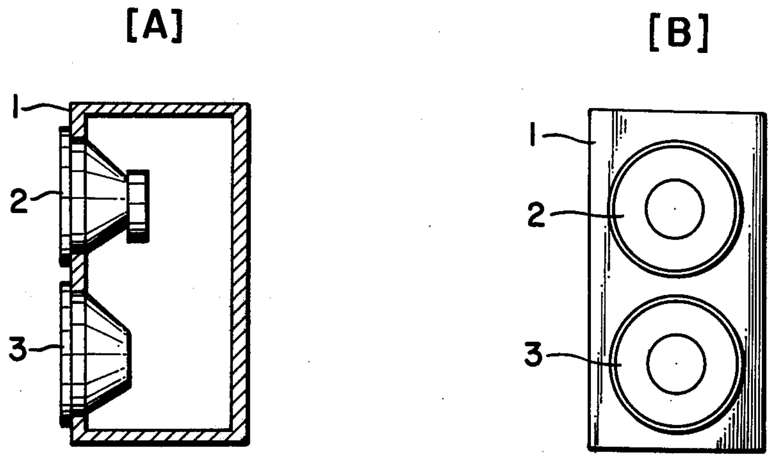
Fig.1 (Prior Art)
FIGS. 1A and 1B respectively are a sectional side view and a front view of a conventional speaker system having a passive diaphragm.
Figure 2:
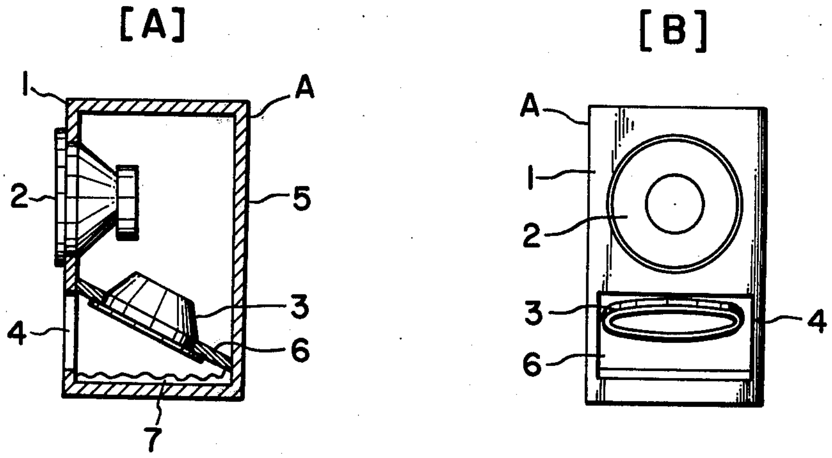
FIGS. 2A and 2B are respectively a sectional side view and a front view of a first illustrative embodiment of this invention.
Figure 3:
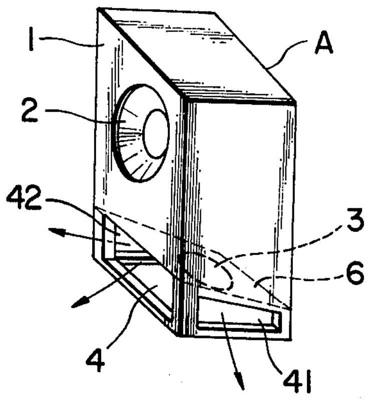
FIG. 3 is a perspective view of a second illustrative embodiment of the invention.
Figure 4:
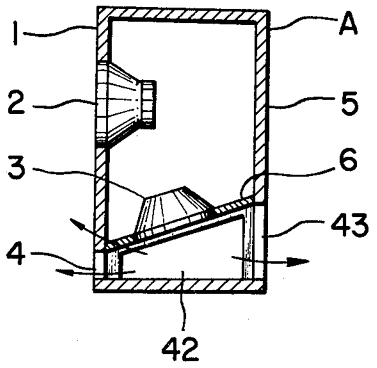
FIG. 4 is a sectional side view of a third illustrative embodiment of the invention.

Reference should be made to the embodiments of the invention shown in FIGS. 2 to 4.

FIGS. 2A and 2B are respectively a sectional side view and a front view of a first illustrative embodiment of the invention. This embodiment has a baffle plate 1 disposed in the front of a speaker cabinet A; a speaker 2 mounted in baffle plate 1; an opening 4 disposed next to speaker 2 as an outlet for the sound radiated from a passive diaphragm 3; and a dividing plate 6 downwardly inclined from baffle plate 1 to a rear plate 5. Dividing plate 6 divides speaker cabinet A into two parts, a first part which includes speaker 2 and a second part which includes opening 4.

Passive diaphragm 3 is mounted in dividing plate 6 so as to radiate sound toward opening 4. Sound absorbing material 7 is disposed in the bottom of cabinet A.

Since dividing plate 6, with passive diaphragm 3 mounted therein, is inclined from baffle plate 1 to rear plate 5, it will be obvious from the front view of the embodiment shown in FIG. 2B that the latter embodiment has a smaller baffle plate 1, and therefore a smaller speaker cabinet than is conventionally employed. Further, since dividing plate 6, with passive diaphragm 3 mounted therein, is inclined, it effectively reduces undesirable standing waves in speaker cabinet A.

Description of a second illustrative embodiment of the invention as shown in FIG. 3 will now be given. In this embodiment, the speaker system has plurality of openings — that is, not only opening 4 but also openings 41 and 42 in the both lower side plates of speaker cabinet A. These are all outlets for the sound radiated from the passive diaphragm.

In a third illustrative embodiment of this invention shown in FIG. 4, the speaker system also has a plurality of openings — that is, openings 4, 41 and 42 and an opening 43 in the rear plate 5 to thereby radiate the sound from passive diaphragm 3 in every direction: forward, backward, rightward and leftward.

Thus, the opening employed in the speaker systems of the second or third embodiments of the invention can (a) obtain a low frequency tonal tone which cannot be obtained with conventional speaker systems, and (b) reduce undesirable sounds at high frequencies. Further, the effects described hereinbefore with respect to the first embodiment shown in FIG. 2 are also obtainable.

What is claimed is:

1. A speaker system comprising a speaker cabinet having a forward baffle plate, two side plates, a rear plate, a top plate and a bottom portion;

a passive diaphragm;

a speaker mounted in said baffle plate of said speaker cabinet;

an opening disposed in said baffle plate next to said speaker as an outlet for the sound radiated from said passive diaphragm;

a dividing plate slantedly disposed between said baffle plate and said rear plate of said speaker cabinet, said dividing plate dividing said speaker cabinet into a first part including said speaker and said top plate and a second part including said opening and said bottom portion, said passive diaphragm being mounted in the dividing plate.

2. A speaker system as in claim 1 where said dividing plate is so slanted in said speaker cabinet that the position thereof at said baffle plate is higher than that at said rear plate.

3. A speaker system as in claim 1 where said dividing plate is so slanted in said speaker cabinet that the position thereof at said baffle plate is lower than that at said rear plate.

4. A speaker system as in claim 1 including openings in said side plates as further outlets for the sound radiated from said passive diaphragm, said openings being disposed in said second part of the speaker cabinet.

5. A speaker system as in claim 4 including an opening in said rear plate as a further outlet for the sound radiated from said passive diaphragm, said latter opening being disposed in said second part of the speaker cabinet.

6. A speaker system as in claim 1 where said bottom portion is a plate.

* * * * *